United States Patent
Parks

(10) Patent No.: US 9,930,276 B2
(45) Date of Patent: Mar. 27, 2018

(54) METHODS FOR CLOCKING AN IMAGE SENSOR

(71) Applicant: SEMICONDUCTOR COMPONENTS INDUSTRIES, LLC, Phoenix, AZ (US)

(72) Inventor: Christopher Parks, Pittsford, NY (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 25 days.

(21) Appl. No.: 15/149,321

(22) Filed: May 9, 2016

(65) Prior Publication Data

US 2017/0208284 A1 Jul. 20, 2017

Related U.S. Application Data

(60) Provisional application No. 62/278,563, filed on Jan. 14, 2016.

(51) Int. Cl.
*H04N 5/372* (2011.01)
*H01L 27/148* (2006.01)

(52) U.S. Cl.
CPC ... *H04N 5/37213* (2013.01); *H01L 27/14812* (2013.01); *H01L 27/14818* (2013.01); *H01L 27/14831* (2013.01)

(58) Field of Classification Search
CPC ............... H04N 5/37213; H01L 27/14812
See application file for complete search history.

(56) References Cited

U.S. PATENT DOCUMENTS

| | | | |
|---|---|---|---|
| 8,773,564 B2 | 7/2014 | Parks | |
| 2006/0163474 A1 | 7/2006 | Denvir | |
| 2007/0214200 A1 | 9/2007 | Hazelwood | |
| 2008/0230680 A1* | 9/2008 | Yatokoro | H04N 5/243 250/207 |
| 2009/0231456 A1 | 9/2009 | Robbins | |
| 2011/0273603 A1* | 11/2011 | Suzuki | H01L 27/14609 348/311 |

* cited by examiner

*Primary Examiner* — Ahmed A Berhan
(74) *Attorney, Agent, or Firm* — Treyz Law Group, P.C.; Joseph F. Guihan

(57) ABSTRACT

Methods of measuring and calibrating the gain of a CCD imaging system are described. Charge injectors may be present on either side of an image sensor array that provide test charges to respective calibration VCCDs. Test charges may be transferred to upper and lower HCCDs during quad-output read out or to only the lower HCCD during dual-output or single-output read out. In each quadrant of the imaging system, test charges may be transferred to an EMCCD output or to a non-EMCCD output via a charge switch based on the magnitude of the test charges. The gains of all EMCCD outputs and non-EMCCD outputs in the imaging system may be calibrated against one another by adjusting the gain at each output when a discrepancy is detected between any two outputs.

19 Claims, 8 Drawing Sheets

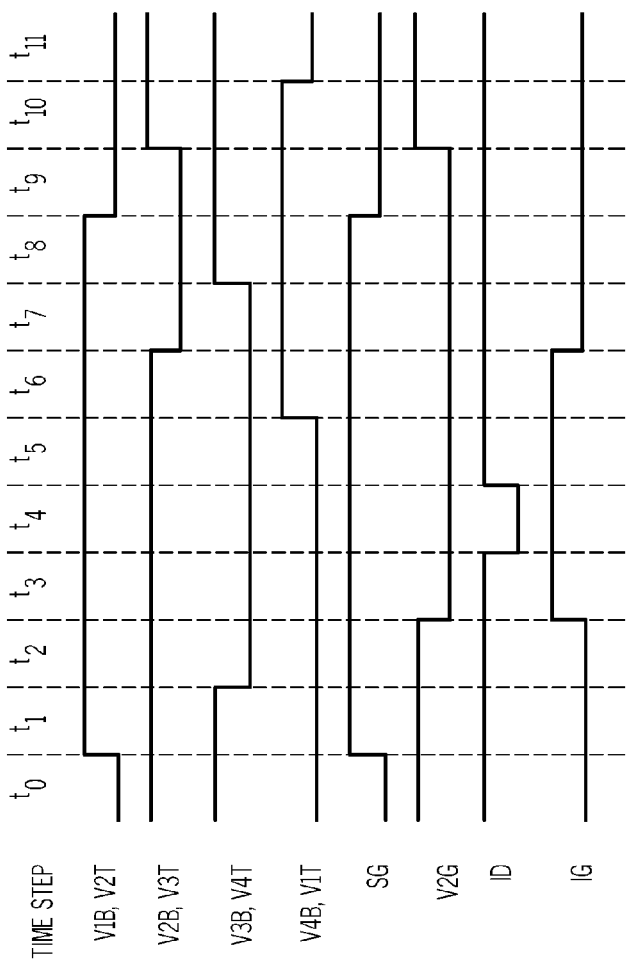

METHODS FOR CLOCKING AN IMAGE SENSOR

CROSS-REFERENCE TO RELATED APPLICATION(S)

This application claims priority to U.S. Provisional Application No. 62/278,563, filed on Jan. 14, 2016, entitled "Methods for Clocking an Image Sensor," invented by Christopher Parks, and is incorporated herein by reference and priority thereto for common subject matter is hereby claimed.

BACKGROUND

This relates generally to imaging systems, and more particularly to output gain measurement and calibration methods for charge-coupled device (CCD) imaging systems having multiple outputs.

Electronic devices such as cellular telephones, cameras, and computers often include imaging systems that include digital image sensors for capturing images. Image sensors may be formed having a two-dimensional array of image pixels that contain photodiodes that convert incident photons (light) into electrical signals. Electronic devices often include displays for displaying captured image data.

Conventional interline CCD imagers are provided with multiple photodiodes that are formed below a pinning layer. In a conventional imager, the photodiodes are typically n-type doped regions in a semiconductor substrate. The pinning layer formed over the photodiodes is usually a p-type doped layer. The pinning layer formed over the photodiodes is conventionally coupled to ground and serves as a ground for the photodiode. The potential of the photodiode remains constant as long as the voltage provided at the pinning layer is constant, and there is no net global current flow throughout the device.

Light incident on the imager results in the accumulation of photo-generated electrons in the n-type photodiode region. Some of these photo-generated electrons are read out into a vertical CCD (VCCD) by applying a read-out voltage (sometimes referred to as the "third-level voltage") to a transfer gate that is formed over the VCCD and a region between the photodiode and the VCCD.

The "third-level voltage" conventionally used in the read-out of photo-generated charges from photodiodes to the VCCD is usually a large voltage greater than 7 V.

The photo-generated electrons are then read out from each VCCD to a horizontal CCD (HCCD), where they are then transferred to an associated output. In some conventional CCD image sensors, an electron multiplier CCD (EMCCD) is incorporated into the HCCD path in order to increase magnitude of signal levels at the output so that they are in a readable range. In order to measure the gain provided by an EMCCD, conventional image sensors use a controlled light source that results in a known amount of charge being generated at each photodiode of the image sensor. This known amount of charge is then read out through both EMCCD outputs and non-EMCCD outputs so that an EMCCD gain measurement can be obtained. The controlled light source used in this method is often built into the system housing the imager. However, this method is undesirable for video capture operations, as it requires the video stream to be interrupted so that a light can be flashed to measure gain.

Some conventional CCD imagers use content in a captured image to measure EMCCD gain, but this method cannot be relied upon if the captured image only generates small signals in the CCD imager (e.g., in low light conditions).

Some conventional CCD imagers rely on defective pixels having high levels of dark current to measure EMCCD gain, but this method requires pixel defects to operate and is not applicable to CCD imagers having few or no defective pixels.

Some conventional CCD imagers rely on changes in EMCCD voltage or temperature to calculate EMCCD gain, but this method is not desirable because changing EMCCD voltage or temperature will alter the appearance of a captured image.

Some conventional CCD imagers rely on injecting charge directly into the entrance of an EMCCD in order to inject a known signal size for gain calibration. However, obtaining a ratio of signals with and without gain using such a method requires altering the EMCCD voltage, which is undesirable as it will alter the appearance of a captured image. This method is further undesirable as it does not provide a means for matching the outputs of more than one EMCCD.

Accordingly, what is needed is a technique that allows for the measurement and calibration of the output gains of multiple EMCCDs within a single CCD imager, while avoiding the disadvantages associated with the above-noted conventional techniques.

BRIEF DESCRIPTION OF THE DRAWINGS

FIG. 9 is an illustrative timing diagram that shows the signal levels applied to the gates of a calibration VCCD, an injection gate, and an injection diode during dual-output and single-output CCD read out operations in accordance with an embodiment.

DETAILED DESCRIPTION

Figure 1:
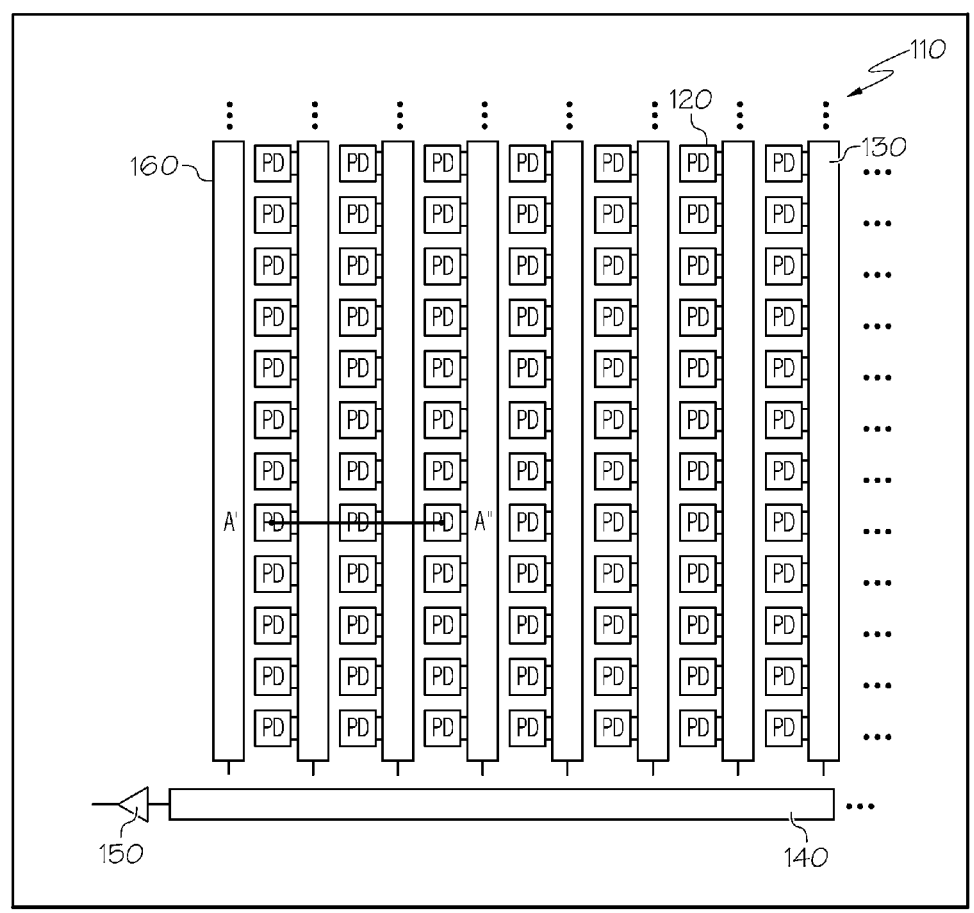
FIG. 1 is a block diagram of an interline CCD image sensor in accordance with an embodiment.

FIG. 1 is a diagram of the basic configuration of an interline charge-coupled device (CCD) image sensor 110.

Image sensor 110 may integrated into a vehicle safety system (e.g., a rear-view camera or other vehicle safety system), a surveillance system, an electronic device such as a camera, a cellular telephone, a video camera, or any other desired electronic device that captures digital image data. The light gathering units may include an array of photodiodes 120 arranged in rows and columns. Photodiodes 120 may each be associated with an image pixel, and may be therefore be interchangeably referred to as "pixel photodiodes." Light filtering elements such as color filters, plasmonic light filters, resonance enhanced color filters, or any other filter elements may be formed over each of photodiodes 120. Lens elements such as microlenses may also be formed over photodiodes 120.

Each column of photodiodes 120 in image sensor 110 may be associated with a respective vertical CCD (VCCD) 130. One or more horizontal CCDs (HCCDs) 140 may also be provided in image sensor 110, and may be coupled to an output amplifier 150 that provides image pixel signals to additional image readout and processing circuitry (not shown). In a progressive scan readout mode, every photodiode 120 may simultaneously transfer some or all of the photo-generated charge collected in the photodiode during an image capture mode, to their respective VCCDs 130. As an example, some or all of the photo-generated charge from photodiodes 120 in a first column of image sensor 110 may be transferred to a first VCCD 130, while some or all of the photo-generated charge from photodiodes 120 in a second column of image sensor 110 may be transferred to a second VCCD 130 at the same time.

Charge in the VCCDs 130 may be read out by transferring all columns in parallel, one row at a time, into the HCCD 140. As an example, charge associated with every row of all the VCCDs 130 associated with every column in the image sensor may be transferred one row towards the HCCD 140. At the same time, charge associated with the first row of image sensor 110 adjacent to the HCCD 140 is transferred from VCCDs 130 to HCCD 140.

Once HCCD 140 receives charge associated with a given row from VCCDs 130, the HCCD 140 may then serially transfer charge to an output amplifier 150. To increase frame rate, interline CCDs may have more than one output amplifier (not shown). In some instances, HCCD 140 may be duplicated at the opposite side of image sensor 110 (e.g., for multi-output read out operations). The duplicate HCCD may serve the same purpose and may have the same functionality as HCCD 140.

To transfer the charge packets, there are polysilicon gates in the VCCD 130 and HCCD 140 regions. Within a pixel, the VCCD 130 and HCCD 140 regions include of one or more polysilicon gates. Clocking the voltages on these gates between two potentials provides a means for transferring the charge in a bucket-brigade fashion.

Calibration VCCD 160 may not receive charge from any of photodiodes 120. Instead, charge may be applied to a center row of calibration VCCD 160 using a charge injection device (not shown). Charge injected into calibration VCCD 160 may be used for downstream calibration and measurement operations. For example, charge injected into VCCD 160 may be used in calibrating the output gain of one or more electron multiplier CCDs (EMCCD). Calibration VCCD 160 may be duplicated at the opposite side of image sensor 110. The duplicate calibration VCCD may serve the same purpose and may have the same functionality as calibration VCCD 160.

Figure 2:
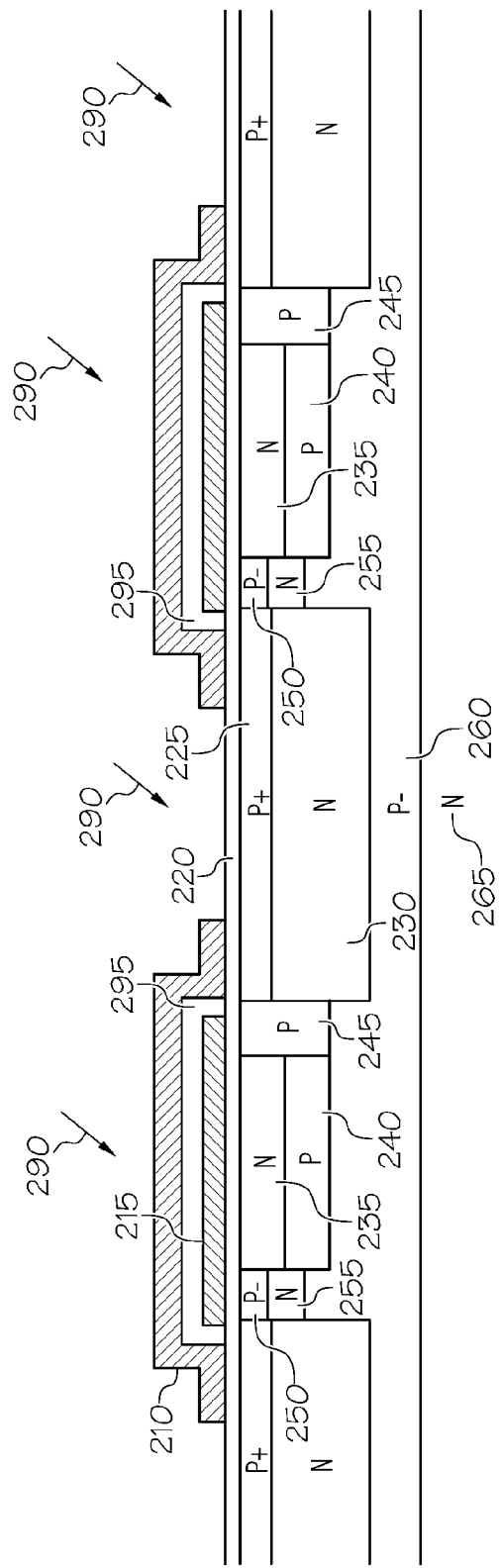
FIG. 2 is a cross-sectional side view through line A'-A" in FIG. 1 of an interline CCD with a light-shield in accordance with an embodiment.

FIG. 2 is a cross-sectional side view through line A'-A" in FIG. 1 for an interline CCD such as image sensor 110. The lightshield 210 may block incident light 290 from striking the gate electrode 215 and reaching the channel implant that defines the VCCD 235. Lightshield 210 may be formed over n-type implant 235 (sometimes referred to as "the VCCD channel 235") and may be formed at least partially over photodiode 230. Specifically, as illustrated in FIG. 2, lightshield 210 may be formed above at least a portion of pinning implant 225 that is formed above photodiode 230. Lightshield 210 may be formed over gate 215, and may be separated from gate 215 by a dielectric 295. Gate 215 may be formed at least partially over p-doped region 245 and p-implant 250.

The channel implant that defines the VCCD 235 may include p-doped regions 240 and 245. Gate dielectric 220 may electrically isolate the gate 215 from the semiconductor in which doped regions 225-260 are formed. Semiconductor substrate 265 and doped regions 225-260 may be collectively referred to as "the semiconductor." P+ pinning implant 225 may have a high enough concentration of p-type dopants to accumulate holes at the interface of dielectric 220 and the semiconductor. This hole-accumulation layer reduces dark current and establishes the ground connection to the periphery of the pixel array of image sensor 110. The P+ pinning implant 225 may be shared for pixels in a given column, and may be formed over multiple photodiodes 120 in a given column of image sensor 110.

Photo-generated electrons may be collected in the photodiode 230. The deep P-region 260 may establish a vertical overflow drain between the photodiode 230 and the N substrate 265. In bright light situations, the excess charge carriers from the photodiode 230 may flow into the substrate instead of blooming into the VCCD channel 235. The P-type implants 240 and 245 may provide isolation between the VCCD channel 235 and the photodiode 230. The P-implant 250 and N implant 255 may set the transfer gate potential between the photodiode 230 and VCCD channel 235.

Photogenerated electrons that are collected in the photodiode 230 are transferred to the VCCD channel 235 by applying a positive voltage on the gate electrode 215. For an interline CCD this voltage is typically greater than 7 V.

Figure 3:
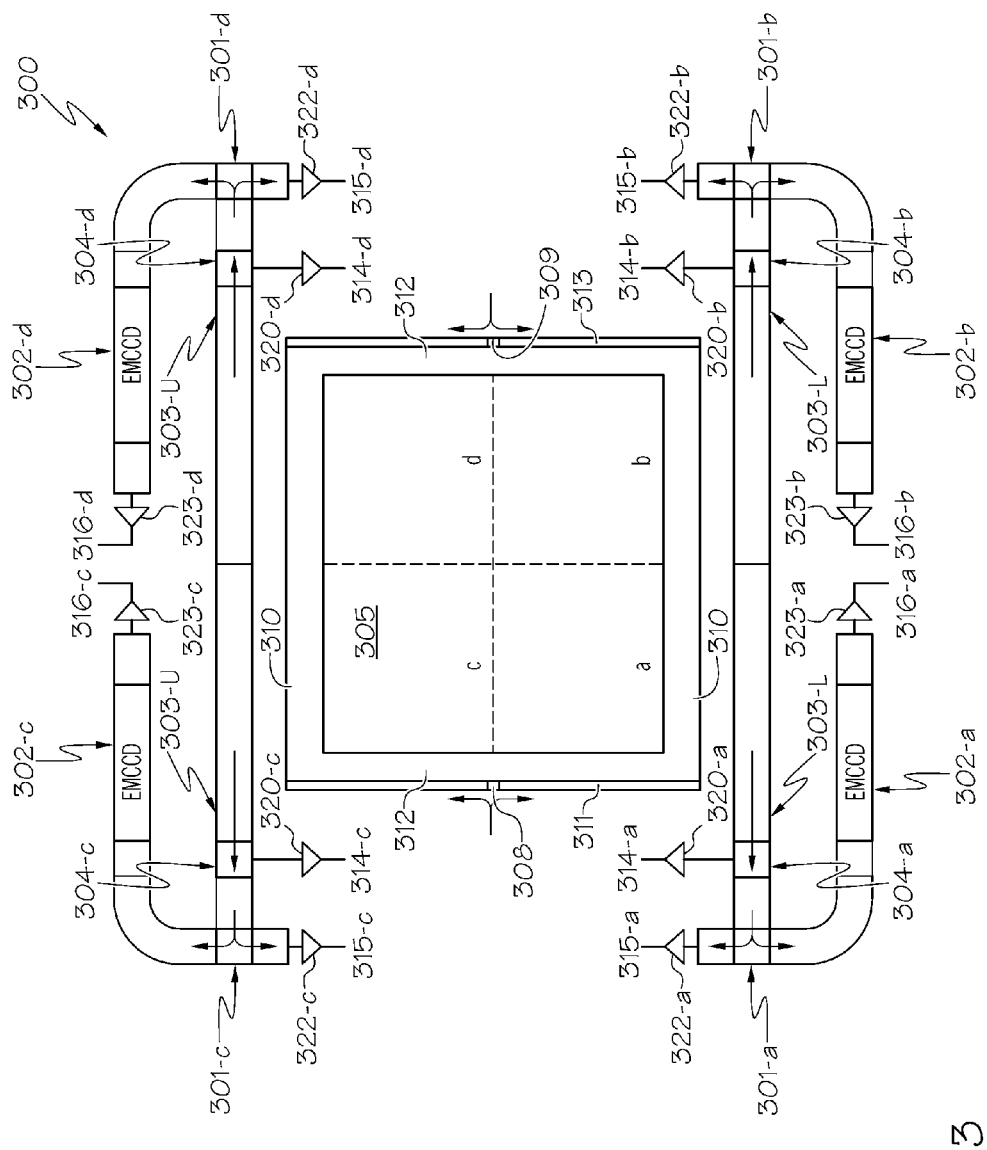
FIG. 3 is a top-down view of an illustrative CCD imaging system having two charge injectors, four EMCCD outputs, and four non-EMCCD outputs in accordance with an embodiment.

FIG. 3 illustrates a top-down view of an imaging system 300 that may include an interline CCD image sensor such as image sensor 110. The present invention may be applied to an interline CCD with any number of rows and columns. CCD image sensor 305 may include an array of photosensitive elements (e.g., photodiodes) arranged in rows and columns. Each column of photosensitive elements may be coupled to a corresponding VCCD. Each VCCD may pass charge accumulated in corresponding photodiodes to HCCDs 303-U and 303-L. Dark columns 312 located at the left and right edges of CCD image sensor 305 may be dark columns having photosensitive elements that do not receive light during image capture operations. These photosensitive elements may be shielded by metal to prevent detection of light or these photosensitive elements may be omitted entirely while their corresponding VCCDs may still be included. The 312 dark columns may be used by imaging system 300 as a zero reference to subtract any dark current offsets during down-stream processing. Dark rows 310 may be included for the same purpose as dark columns 312 and may have similar structure to dark columns 312.

Imaging system 300 may be divided into four quadrants "a", "b", "c", and "d". Each quadrant may have associated photosensitive elements and read-out circuitry. A captured image may be read out of any one quadrant, any two quadrants, or all four quadrants simultaneously.

When reading out of all four quadrants of imaging system 300 simultaneously, VCCDs in CCD image sensor 305 may be programmed to shift charge from the upper half of the array of photosensitive elements in CCD image sensor 305 to HCCD 303-U and to shift charge from the lower half of the array of photosensitive elements in CCD image sensor 305 to HCCD 303-L. HCCDs 303-U and 303-L may each be split in half to shift the left half of charges received by HCCDs 303-U and 303-L toward readout circuitry in quadrants "a" and "c" and to shift the right half of charges toward readout circuitry in quadrants "b" and "d". For example, charges generated by photosensitive elements in quadrant "a" of CCD image sensor 305 may be transferred to associated VCCDs which may then transfer the charges to HCCD 303-L. HCCD 303-L may then pass the charges through floating gate sense node 304-$a$ to charge switch 301-$a$. Floating gate sense node 304-$a$, in combination with floating gate amplifier 320-$a$, may measure the magnitude of charges that pass through the floating gate sense node 304-$a$. Charge switch 301-$a$ may selectively route the charges either directly to output 315-$a$ or through EMCCD 302-$a$ to output 316-$a$. Selective routing performed by charge switch 301-$a$ may be based on the detected magnitude of the charges being routed. For example, charges below a threshold magnitude may be routed to EMCCD 302-$a$ for amplification before being passed to output 316-$a$ (sometimes referred to herein as high-gain output 316-$a$). Charges above the threshold magnitude may be routed directly to output 315-$a$ without undergoing EMCCD amplification (sometimes referred to herein as low-gain output 315$a$). It should be noted that this read out method may be applied to the read out circuitry in each quadrant of imaging system 300. Alternatively, VCCDs in CCD image sensor 305 may be programmed to shift charge from the entire array of photosensitive elements in CCD image sensor 305 to HCCD 303-L. The charge may then be transferred read out circuitry in only quadrant "a" for single-output read out operations or in both quadrants "a" and "b" for dual-output read out operations.

Calibration VCCDs 311 and 313 may receive test charges (sometimes referred to herein as injected charges) from charge injection devices 308 and 309 (sometimes referred to herein as charge injection structures 308 and 309). Test charges provided by charge injection devices 308 and 309 may then be transferred to HCCDs 303-U and 303-L.

For example, charge injection device 308 may be pulsed twice, once to inject test charge into calibration VCCD 311 to be transferred to HCCD 303-U and a second time to inject test charge into VCCD 311 to be transferred HCCD 303-L during quad-output read out operations. VCCDs 311 and 313 may each be split in order to accommodate the transferal of test charges to both HCCD 303-L and HCCD 303-U simultaneously. By using a single injector to provide charges to both HCCD 303-L and HCCD 303-U, the same amount of charge can be reliably provided to both HCCD 303-L and HCCD 303-U. This bi-directional charge injection performed by a single charge injection device may prevent non-ideal disparities in the magnitudes of test charges provided to the top and bottom read out circuitries, which could result from using two distinct charge injection devices on each side of CCD image sensor 305. The magnitude of the test charges provided by charge injection devices 308 and 309 may be constant or may be varied across the entire dynamic range of the image sensor. If desired, charge injection devices 308 and 309 may be optical charge injection devices that optically inject charge into VCCDs 311 and 313 respectively.

Output amplifiers 322 and 323 may convert received charge into a voltage output. The charge to voltage conversion factor (gain) is rarely exactly the same between all four quadrants. For example, gain values may vary by 1% to 2%. As the top and bottom output amplifiers can measure charge from the same injector, their gains can be calibrated. For example, if the injected charge signal measured at output 315-$c$ is always 1% less than the injected charge signal measured at output 315-$a$, then output signal at output 315-$c$ may always be multiplied by 1.01 to force it to match output 315-$a$. At small injected charge levels (e.g., <200$c$) charge injection devices 308 and 309 may be used to calibrate EMCCDs 302 in imaging system 300.

Test charges may be injected constantly during imaging operations. In response to detecting discrepancies in both EMCCD and non-EMCCD output gains (e.g., output gain discrepancies between quadrants "a" and "c" and between quadrants "b" and "d"), the magnitude of the amplification provided by the EMCCDs 302 and the output amplifiers 322 and 323 may be adjusted to maintain output matching. By maintaining a slow moving average of injected charge signals, the effect of temperature changes and EMCCD gain drift can be compensated for over time. This gain calibration may be performed continuously while imaging any scene, either light or dark.

It may be desirable to route the same amount of injected charges to EMCCD outputs 316 as to non-EMCCD outputs 315. For example, injected charges for quadrant "a" may be applied at selected magnitudes such that half of injected charges for quadrant "a" are directed to output 315-$a$ and half of injected charges for quadrant "a" are directed to output 316-$a$. Injected charge magnitudes may be close to the threshold value of charge switches 301. By providing the same number of injected charges to EMCCD outputs 316 as to non-EMCCD outputs 315 and by setting the magnitude of each injected charge to the threshold value of charge switches 301, good linearity matching between EMCCD outputs 316 and non-EMCCD outputs 315 can be achieved.

Charge injection devices 308 and 309 may be calibrated against one another in order to match outputs of quadrants "a" and "c" with outputs of quadrants "b" and "d". This can be done once per image while reading out dark rows 310 at the bottom and top edges of CCD image sensor 305, since dark rows 310 may not be used to form the image. During charge injection device calibration, dark rows 310 may be read out to only a single HCCD (e.g., HCCD 303-L). When providing signals from dark rows 310 to the HCCD (e.g., HCCD 303-L), the HCCD may be operated to read out charges from each row of dark rows 310 to the read out circuitry of a single quadrant (e.g., the read out circuitry of quadrant "a"). Based on any discrepancies detected between the injected charges of charge injection device 308 and those of charge injection device 309, the voltage applied to either charge injection device 308 or 309 may be adjusted. For example, if charge injection device 308 always injects 5% more charge than charge injection device 309, then the voltages on charge injection device 309 may be multiplied by 1.05 before use in output matching or EMCCD gain calculations. It should be noted that the read out method used during the read out of the charges of dark rows 310 may not apply to the read out of charges of the remaining rows of CCD image sensor 305.

To further improve the linearity of output amplifiers 322 and 323, the magnitude of charges injected by charge injection devices 308 and 309 may be varied from zero to a maximum signal level. For example, injected charge magnitude may be incremented at each line of a captured image being read out. Alternatively, injected charge magnitude may be incremented once per captured image. When injected charge magnitude is varied in this way, any mismatch between any of output amplifiers 322 and 323 caused by non-linearity differences can be compensated for.

Figure 4:
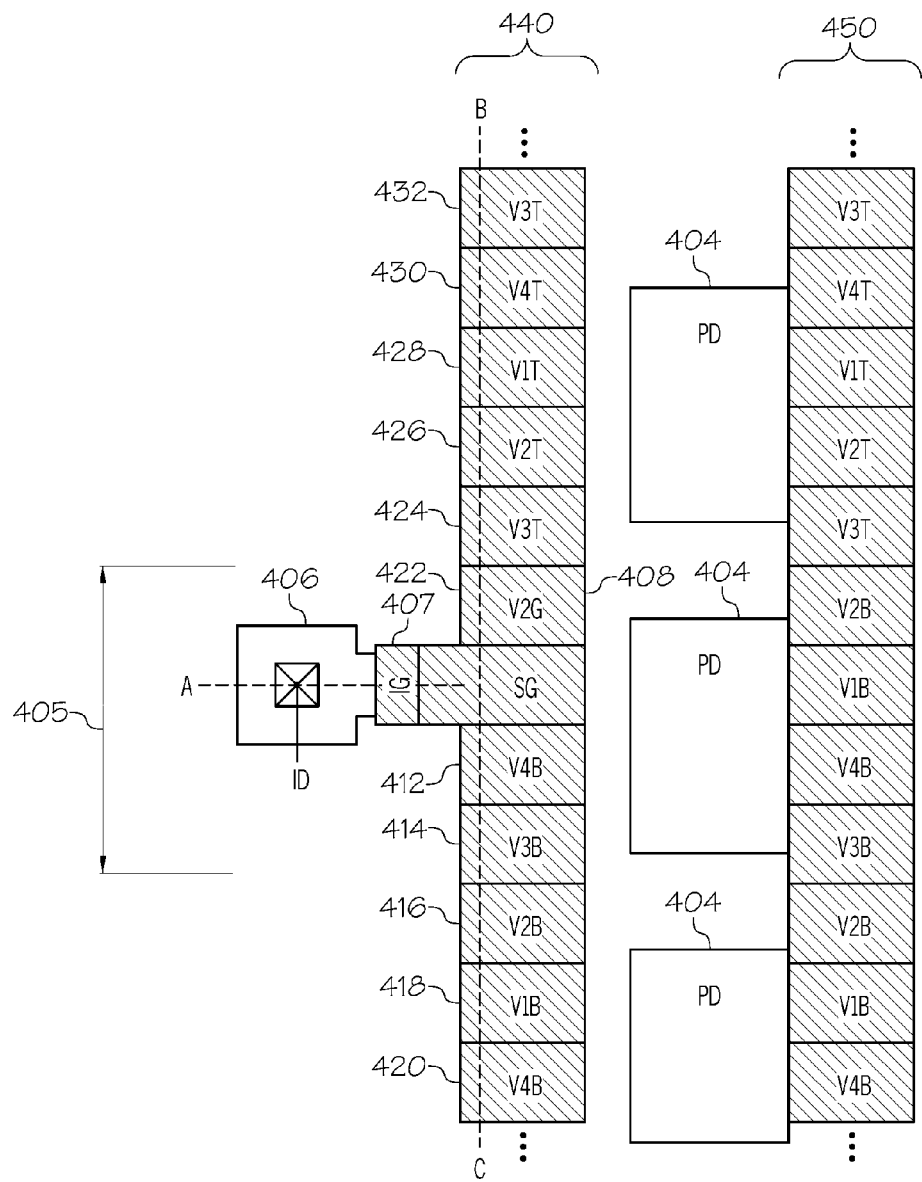
FIG. 4 is a top-down view of an illustrative structure for injecting charge into a calibration VCCD of a CCD image sensor in accordance with an embodiment.

FIG. 4 is a top-down view of a portion of a CCD image sensor such as image sensor 305 in FIG. 3 having charge injection device such as charge injection device 308 in FIG. 3 and a calibration VCCD such as calibration VCCD 311 in FIG. 3. As shown in FIG. 4, injection diode 406 may be coupled to signal gate 408 through injection gate 407. Signal gate 408 may be part of calibration VCCD 440, which may correspond to calibration VCCD 311 of FIG. 3. Calibration VCCD 440 may be different from other VCCDs, such as VCCD 450, in that calibration VCCD 440 may lack photodiodes, such as photodiodes 404. Instead, calibration VCCD 440 may receive charge at pixel row 405 from injection diode 406 through injection gate 407.

During quad-output read operations, calibration VCCD 440 may be split, such that half of the charges injected by injection diode 406 may pass along the path A-B, which consists of gates 407, 408, 422, 424, 426, 428, 430, and 432. The other half of the charges injected by injection diode 406 may pass along the path A-C, which consists of gates 407, 408, 412, 414, 416, 418, and 420. Each path may include additional gates depending on the size of the image sensor array. Alternatively, during dual-output and single-output read operations, calibration VCCD 440 may direct charges along a single path, such as the A-C path (e.g., toward HCCD 303-L in FIG. 3).

Gates 407, 408, 412, 414, 416, 418, 420, 422, 424, 426, 428, 430, and 432 may be controlled by signals IG, SG, V4B, V3B, V2B, V1B, V4B, V2G, V3T, V3T, V2T, V1T, V4T, and V3T respectively. Calibration VCCD 440 may be a four phase VCCD. For example, every fourth gate along the A-B path may receive the same control signal (e.g., gates 424 and 432 may both receive signal V3T). Similarly, every fourth gate along the A-C path may receive the same control signal (e.g., gates 412 and 420 may both receive signal V4B). It should be noted that a mirror image of the charge injection device shown in FIG. 4 may be located on the right-most edge of the CCD image sensor.

Figures 5, 6:
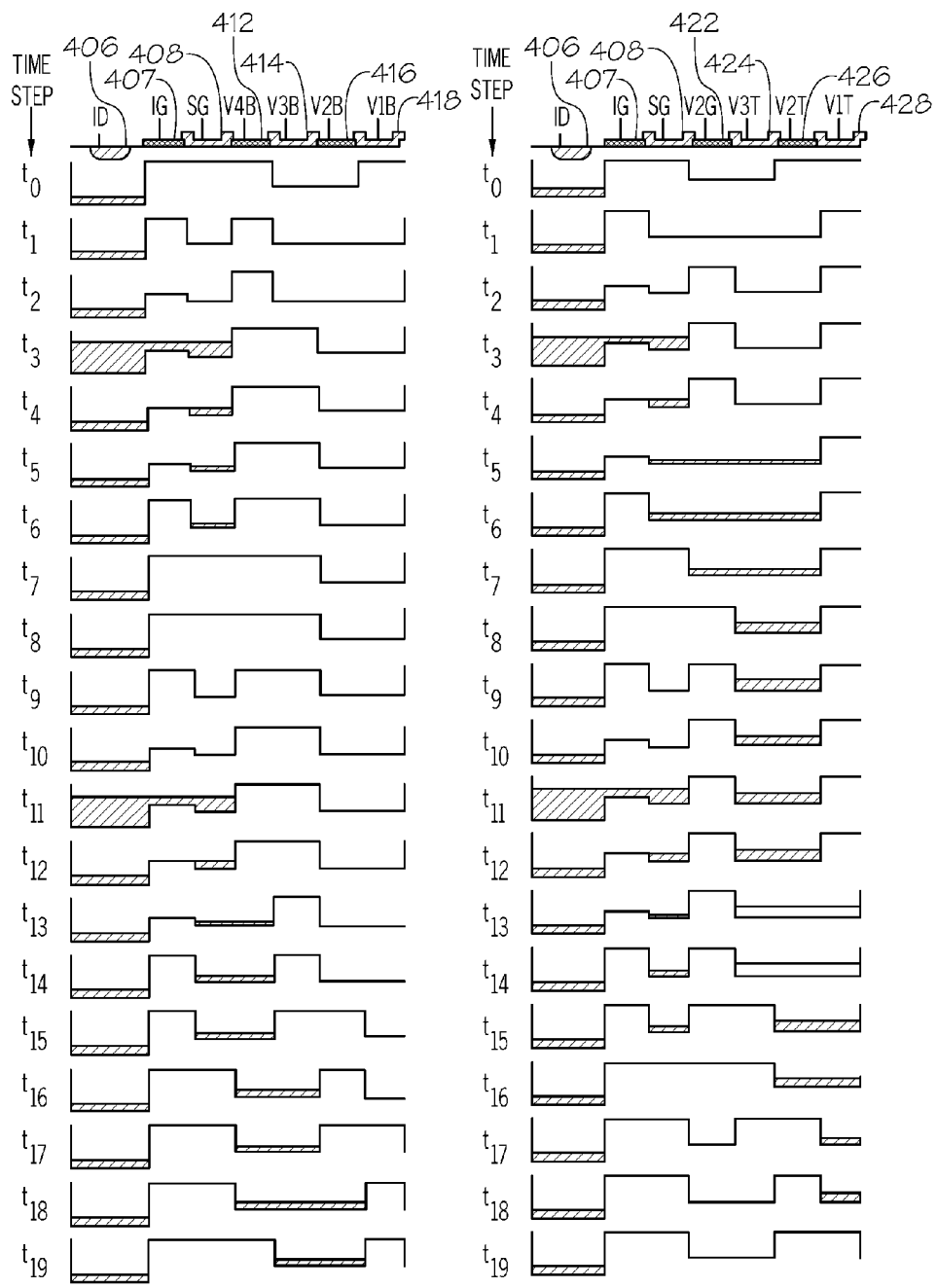
FIG. 5 is an illustrative fluid diagram that shows charge levels and voltage potentials at gates along the A-C path in FIG. 4 during quad-output CCD read out operations in accordance with an embodiment.
FIG. 6 is an illustrative fluid diagram that shows charge levels and voltage potentials along the A-B path in FIG. 4 during quad-output CCD read out operations in accordance with an embodiment.
Figure 7:
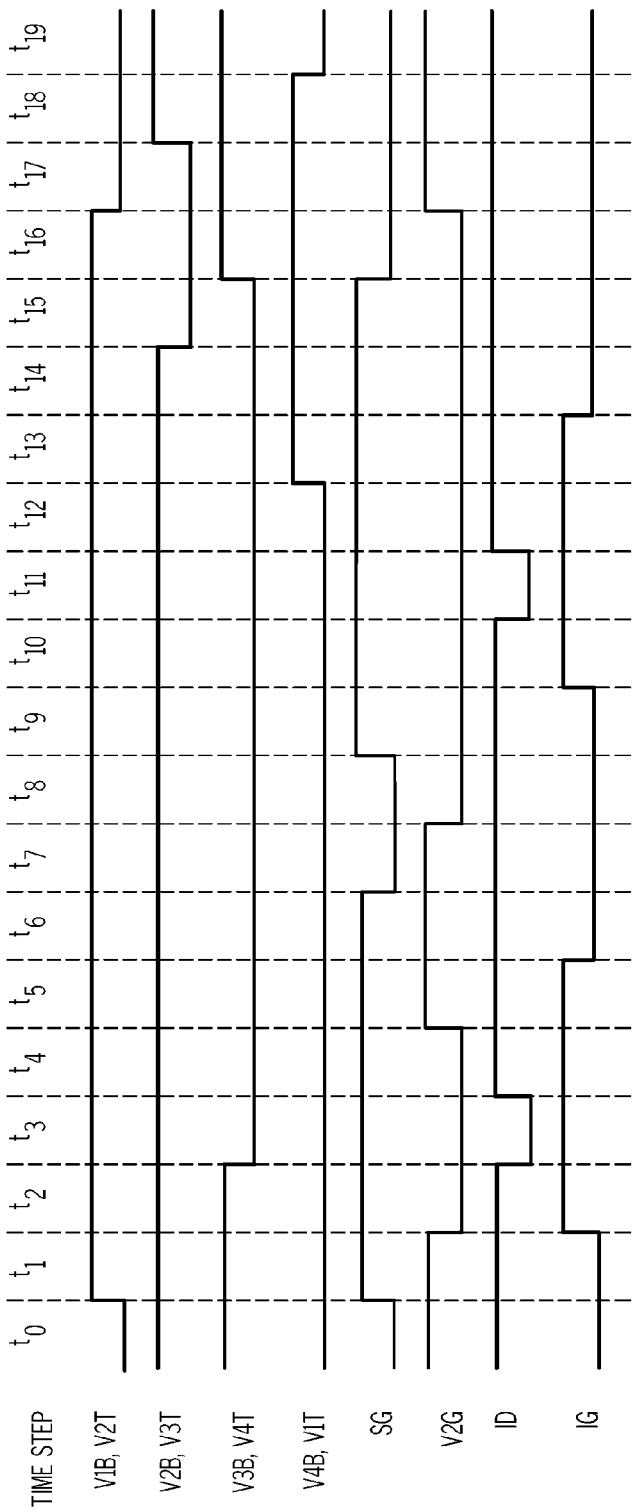
FIG. 7 is an illustrative timing diagram showing the signal levels applied to the gates of a calibration VCCD, an injection gate, and an injection diode during quad-output CCD read out operations in accordance with an embodiment.

FIG. 5 is a fluid diagram that shows charge levels and voltage potentials at gates along the A-C path in FIG. 4 during quad-output CCD read out operations. The read out operations shown in FIGS. 5 and 6 may occur simultaneously and gate signals along each path A-B and A-C may adhere to the timing diagram shown in FIG. 7. Times $t_3$-$t_{10}$ may correspond to charge injection and transfer along path A-B. Accordingly, signal V4B at gate 412 may be held at a low potential from time $t_3$ to time $t_{10}$ to prevent any charge injected during those times from flowing towards the upper HCCD (e.g., HCCD 303-U in FIG. 3). Charge may be provided at injection diode 406 any time signal ID is deasserted. At time $t_{11}$, signal ID may be deasserted to provide charge to injection diode 406 while signals IG and SG are held high such that injected charge passes from injection diode 406 to signal gate 408 through injection gate 407. At time $t_{12}$, signal ID may be reasserted while signals IG and SG are held high such that charge remains in signal gate 408. At times $t_{13}$-$t_{15}$, signal V4B may be held high so that charge is shared between signal gate 408 and gate 412. Signal IG may be held low from times $t_{14}$-$t_{19}$ in order to isolate injection diode 406 from signal gate 408. At times $t_{16}$-$t_{17}$, signal SG may be held low while signals V4B and V3B are held high such that the injected charge is shared between gates 412 and 414. At time $t_{18}$, signal V2B may be held high such that the injected charge is shared between gates 412, 414, and 416. At time $t_{19}$, signal V4B may be held low while signals V3B and V2B are held high such that the injected charge is shared between gates 414 and 416. The injected charge may continue to be passed from gate to gate in this bucket-brigade method of charge transfer until it reaches the lower HCCD (e.g., HCCD 303-L in FIG. 3).

FIG. 6 is a fluid diagram that shows charge levels and voltage potentials at gates along the A-B path in FIG. 4 during quad-output CCD read out operations. The read out operations shown in FIGS. 5 and 6 may occur simultaneously and gate signals along each path A-B and A-C may adhere to the timing diagram shown in FIG. 7. Times $t_{11}$-$t_{16}$ correspond to charge injection and transfer along path A-C. Accordingly, signal V2G at gate 412 may be held at a low potential from time $t_{11}$ to time $t_{16}$ to prevent any charge injected during those times from flowing towards the upper HCCD (e.g., HCCD 303-U in FIG. 3). At time $t_3$, signal ID may be deasserted to provide charge to injection diode 406 while signals IG and SG are held high such that injected charge passes from injection diode 406 to signal gate 408 through injection gate 407. At time $t_4$, signal ID may be reasserted while signals IG and SG are held high such that charge remains in signal gate 408. At times $t_5$-$t_7$, signals SG, V2G, V3T, and V2T may be held high so that charge is shared between signal gate 408, gate 422, gate 424, and gate 426. Signal IG may be held low from times $t_6$-$t_9$ in order to isolate injection diode 406 from signal gate 408. At time $t_7$, signal SG may be held low while signals V2G, V3T and V2T are held high such that the injected charge is shared between gates 422, 424 and 426. At time $t_8$, signal V2G may be held high such that the injected charge is shared between gates 424, 426. At time $t_{13}$, signal V3T may be held low while signals V2T and V1T are held high such that the injected charge is shared between gates 426 and 428. The injected charge may continue to be passed from gate to gate in this bucket-brigade method of charge transfer until it reaches the upper HCCD (e.g., HCCD 303-U in FIG. 3).

Figure 8:
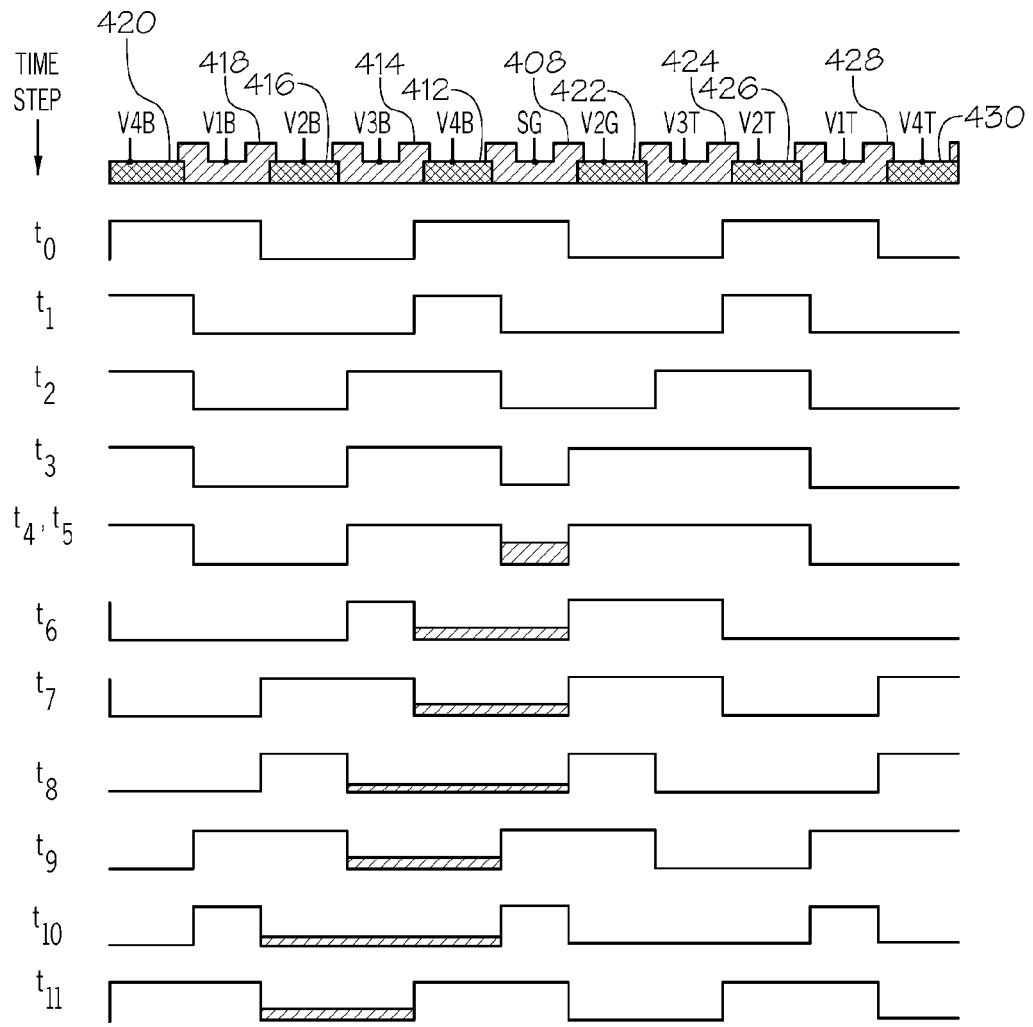
FIG. 8 is an illustrative fluid diagram that shows charge levels and voltage potentials along the B-C path in FIG. 4 during dual-output and single-output CCD read out operations in accordance with an embodiment.

FIG. 8 is a fluid diagram that shows charge levels and voltage potentials at gates along the B-C path in FIG. 4 during single-output and dual-output CCD read out operations. Charge may be applied to signal gate 408 in a similar fashion to the one described above in connection with FIGS. 5 and 6 (e.g., signal ID may be held low to apply charge to injection diode 406, which may then be passed to signal gate 408 through injection gate 407). Gate signals along path B-C may adhere to the timing diagram shown in FIG. 9. Timing for signals ID and IG are provided in FIG. 9 for reference. At time $t_3$, signal IG may be held high. At time $t_4$, signal ID may be deasserted to provide charge to injection diode 406 while signals IG and SG are held high such that the charge may be injected onto to signal gate 408. At time $t_4$, signal ID may be reasserted while the injected charge remains at signal gate 408. At times $t_6$-$t_7$, signals V4B and SG may be held high such that the injected charge is shared between signal gate 408 and gate 412. At times $t_7$-$t_{11}$, signal IG may be held low in order to isolate signal gate 408 from injection diode 406. At time $t_8$, signals SG, V4B, and V3B may be held high such that the injected charge is shared between signal gate 408, gate 412, and gate 414. At time $t_9$, signals V4B and V3B may be held high while signal SG is held low such that the injected charge is shared between gates 412 and 414. At time $t_{10}$, signals V4B, V3B, and V2B may be held high such that the injected charge is shared between gates 412, 414, and 416. At time $t_{11}$, signals V3B and V2B may be held high while signal V4B is held low such that the injected charge is shared between gates 414 and 416. The injected charge may continue to be passed from gate to gate in this bucket-brigade method of charge transfer until it reaches the lower HCCD (e.g., HCCD 303-L in FIG. 3). It should be noted that in the single-output and dual-output read out operations described above, signal V2G may be held low whenever charge is on signal gate 408 in order to prevent charge from being transferred toward the upper HCCD (e.g., HCCD 303-U in FIG. 3).

Various embodiments have been described illustrating methods of measuring output gains in a CCD imaging system. An imaging system may include an array of photosensitive elements, a plurality of vertical charge-coupled devices that are each coupled to a respective column of photosensitive elements in the array of photosensitive elements, an upper horizontal charge-coupled device coupled to the plurality of vertical charge-coupled devices, a lower charge-coupled device coupled to the plurality of vertical charge-coupled devices, a calibration vertical charge-coupled device coupled to at least one of the upper and lower horizontal charge-coupled devices, and a charge injection structure may inject a test charge into a center row of the calibration vertical charge-coupled device. The plurality of vertical charge-coupled devices may transfer charge from the array of photosensitive elements to at least one of the upper and lower horizontal charge-coupled devices The charge injection structure may be a first charge injection structure. The test charge may be a first test charge. The calibration vertical charge-coupled device may be a first calibration vertical charge-coupled device. The imaging system may further include a second calibration vertical charge-coupled device coupled to at least one of the upper and lower horizontal charge coupled devices, and a second charge injection structure that may inject a second test charge into a center row of the second vertical charge-coupled device.

First and last columns of the array of photosensitive elements may be dark columns having light blocking structures that prevent photosensitive elements in the dark columns from receiving incoming light.

First and last rows of the array of photosensitive elements may be dark rows having light blocking structures that prevent photosensitive elements in the dark rows from receiving incoming light.

The imaging system may be divided into four quadrants. Each of the four quadrants may include a charge switch that receives charge from one of the upper and lower horizontal charge-coupled devices, an electron multiplier device, a first imaging system output coupled to the electron multiplier device, and a second imaging system output. The charge switch may be coupled between the second imaging system output and the electron multiplier device. The charge switch may selectively pass the charge received by the charge switch to the first imaging system output through the electron multiplier device in a first configuration and to the second imaging system output in a second configuration. The charge switch may selectively pass charge received by the charge switch based on the magnitude of the received charge.

Each of the four quadrants may further include a floating gate amplifier and a floating gate sense node coupled to the floating gate amplifier and interposed into a corresponding one of the upper and lower horizontal charge-coupled devices. The floating gate sense node and the floating gate amplifier may measure the magnitude of the received charge. The first and second calibration vertical charge-coupled devices may only receive test charges from the first and second charge injection structures, respectively.

In some embodiments, the charge injection structure may include an injection diode and an injection gate interposed between the injection diode and the center row of the calibration vertical charge-coupled device. The injection diode may provide the test charge to the center row of the calibration vertical charge-coupled device through the injection gate.

A method for calibrating the gain of outputs of an image sensor in an imaging system may include injecting at least one charge into a center row of at least one vertical charge-coupled device in the image sensor with at least one charge injector, shifting the at least one charge to at least one horizontal charge-coupled device with the at least one vertical charge-coupled device, shifting the at least one charge to at least one charge switch with the at least one horizontal charge-coupled device, selectively routing the at least one charge to at least one low-gain output when the at least one charge is detected to be above a threshold magnitude and to at least one high-gain output when the at least one charge is detected to be below the threshold magnitude with the at least one charge switch, and adjusting gains of the at least one high-gain output and the at least one low-gain output such that the gains are linearly matched.

Injecting at least one charge into a center row of at least one vertical charge-coupled device in the image sensor may include injecting a first charge into a center row of a first vertical-charge coupled device in the image sensor with a first charge injector, and injecting a second charge into a center row of a second vertical charge-coupled device in the image sensor with a second charge injector.

Shifting the injected charge to at least one horizontal charge-coupled device may include shifting the first charge to the at least one horizontal charge-coupled device with the first vertical charge-coupled device, and shifting the second charge to the at least one horizontal charge-coupled device with the second vertical charge-coupled device.

Injecting at least one charge into a center row of at least one vertical charge-coupled device in the image sensor may further include injecting a third charge into the center row of the first vertical charge-coupled device in the image sensor with the first charge injector and injecting a fourth charge into the center row of the second vertical charge-coupled device in the image sensor with the second charge injector.

The at least one horizontal charge-coupled device may include upper and lower horizontal charge-coupled devices. The first and second charges may be shifted to the upper horizontal charge coupled device. The third and fourth charges may be shifted to the lower horizontal charge-coupled device.

Shifting the at least one charge to at least one charge switch may include shifting the first charge to a first charge switch with the upper horizontal charge-coupled device, shifting the second charge to a second charge switch with the upper horizontal charge-coupled device, shifting the third charge to a third charge switch with the lower horizontal charge-coupled device, and shifting the fourth charge to a fourth charge switch with the lower horizontal charge-coupled device.

Selectively routing the at least one charge to at least one low-gain output when the at least one charge is detected to be above a threshold magnitude and to at least one high-gain output when the at least one charge is detected to be below a threshold magnitude may include selectively routing the first charge to a first low-gain output when the first charge is detected to be above a threshold magnitude and to a first high-gain output when the first charge is detected to be below the threshold magnitude with the first charge switch, selectively routing the second charge to a second low-gain output when the second charge is detected to be above the threshold magnitude and to a second high-gain output when the second charge is detected to be below the threshold magnitude with the second charge switch, selectively routing the third charge to a third low-gain output when the third charge is detected to be above the threshold magnitude and to a third high-gain output when the third charge is detected to be below the threshold magnitude with the third charge switch, and selectively routing the fourth charge to a fourth low-gain output when the fourth charge is detected to be above the threshold magnitude and to a fourth high-gain output when the first charge is detected to be below the threshold magnitude with the fourth charge switch.

Adjusting gains of the at least one high-gain output and the at least one low-gain output such that the gains are linearly matched may include adjusting the gains of each of the high-gain outputs and each of the low-gain outputs such that the gain of each high-gain output is respectively linearly matched with the gain of a corresponding one of the low-gain outputs.

The method may further include detecting magnitudes of the first, second, third, and fourth charges with floating gate sense nodes in the upper and lower horizontal charge-coupled devices, calculating the gains of electron multiplying charge-coupled devices at each of the high-gain outputs based on average signal values at each of the high-gain outputs and each of the low-gain outputs, matching the gain of each of the high-gain outputs by adjusting the gain at each of the high-gain outputs based on measured high-gain output values, and matching the gains of each of the low-gain outputs by adjusting the gain at each of the low-gain outputs based on measured low-gain output values. Injecting at least one charge into a center row of at least one vertical charge-coupled device in the image sensor may include optically injecting at least one charge into a center row of at least one vertical charge-coupled device in the image sensor.

A method for calibrating the gain of the outputs of an image sensor in an imaging system may include injecting first test charges into a first vertical charge-coupled device in the image sensor with a first charge injector, injecting second test charges into a second vertical charge-coupled device in the image sensor with a second charge injector, transferring a first portion of the first test charges to an upper horizontal charge-coupled device and transferring a second portion of the first test charges to a lower horizontal charge-coupled device with the first vertical charge-coupled device, transferring a first portion of the second test charges to the upper horizontal charge-coupled device and transferring a second portion of the second test charges to the lower horizontal charge-coupled device with the second vertical charge-coupled device, transferring the first portion of the first test charges to a first output through a first charge switch with the upper horizontal charge-coupled device, transferring the first portion of the second test charges to a second output through second charge switch with the upper horizontal charge-coupled device, transferring the second portion of the first test charges to a third output through a third charge switch with the lower horizontal charge-coupled device, transferring the second portion of the second test charges to a fourth output through a fourth charge switch with the lower horizontal charge-coupled device, and calibrating the first, second, third, and fourth outputs to have matching gains based on measured magnitudes of the first and second portions of the first test charges and the first and second portions of the second test charges, wherein the magnitudes are measured at the respective first, second, third and fourth outputs.

Calibrating the first, second, third, and fourth outputs may be performed continuously while the imaging system is in use. The first test signals and the second test signals may be injected into each image frame captured by the image sensor such that the gains of the first, second, third, and fourth outputs are continuously stabilized.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging system comprising:
    an array of photosensitive elements;
    a plurality of vertical charge-coupled devices that are each coupled to a respective column of photosensitive elements in the array of photosensitive elements;
    an upper horizontal charge-coupled device coupled to the plurality of vertical charge-coupled devices;
    a lower horizontal charge-coupled-device coupled to the plurality of vertical charge-coupled devices, wherein the plurality of vertical charge-coupled devices transfer charge from the array of photosensitive elements to at least one of the upper and lower horizontal charge-coupled devices;
    a calibration vertical charge-coupled device coupled to at least one of the upper and lower horizontal charge-coupled-devices; and
    a charge injection structure that injects a test charge into a center row of the calibration vertical charge-coupled device, wherein the charge injection structure comprises:
        an injection diode; and
        an injection gate interposed between the injection diode and the center row of the calibration vertical charge-coupled device, wherein the injection diode provides the test charge to the center row of the calibration vertical charge-coupled device through the injection gate.

2. The imaging system of claim 1, wherein the charge injection structure comprises a first charge injection structure, wherein the test charge comprises a first test charge, wherein the calibration vertical charge-coupled device comprises a first calibration vertical charge-coupled device, and wherein the imaging system further comprises:
    a second calibration vertical charge-coupled device coupled to at least one of the upper and lower horizontal charge-coupled devices; and
    a second charge injection structure that injects a second test charge into a center row of the second vertical charge-coupled device.

3. The imaging system of claim 2 wherein first and last columns of the array of photosensitive elements comprise dark columns having light blocking structures that prevent photosensitive elements in the dark columns from receiving incoming light.

4. The imaging system of claim 3, wherein first and last rows of the array of photosensitive elements are dark rows having light blocking structures that prevent photosensitive elements in the dark rows from receiving incoming light.

5. The imaging system of claim 4 wherein the imaging system is divided into four quadrants and wherein each of the four quadrants comprises:
    a charge switch that receives charge from one of the upper and lower horizontal charge-coupled devices;
    an electron multiplier device;

a first imaging system output coupled to the electron multiplier device; and a second imaging system output wherein the charge switch is coupled between the second imaging system output and the electron multiplier device and wherein the charge switch selectively passes the charge received by the charge switch to the first imaging system output through the electron multiplier device in a first configuration and to the second imaging system output in a second configuration.

6. The imaging system of claim 5 wherein the charge switch selectively passes the charge received by the charge switch based on the magnitude of the received charge, and wherein each of the four quadrants further comprises:

a floating gate amplifier; and a floating gate sense node coupled to the floating gate amplifier and interposed into a corresponding one of the upper and lower horizontal charge-coupled devices, wherein the floating gate sense node and the floating gate amplifier measure the magnitude of the received charge.

7. The imaging system of claim 3, wherein the first and second calibration vertical charge-coupled devices only receive test charges from the first and second charge injection structures, respectively.

8. The imaging system defined in claim 1, wherein the calibration vertical charge-coupled device is coupled to the upper horizontal charge-coupled device, wherein the calibration vertical charge-coupled device is coupled to the lower horizontal charge-coupled device, wherein the calibration vertical charge-coupled device has a first number of rows between the center row and the upper horizontal charge-coupled device, and wherein the calibration vertical charge-coupled device has a second number of rows that is equal to the first number of rows between the center row and the lower horizontal charge-coupled device.

9. A method for calibrating a gain of a outputs of an image sensor in an imaging system comprising:

with at least one charge injector, injecting at least one charge into a center row of at least one vertical charge-coupled device in the image sensor;

with the at least one vertical charge-coupled device, shifting the at least one charge to at least one horizontal charge-coupled device;

with the at least one horizontal charge-coupled device, shifting the at least one charge to at least one charge switch;

with the at least one charge switch, selectively routing the at least one charge to at least one low-gain output when the at least one charge is detected to be above a threshold magnitude and to at least one high-gain output when the at least one charge is detected to be below the threshold magnitude; and adjusting gains of the at least one high-gain output and the at least one low-gain output such that the gains are linearly matched, wherein injecting at least one charge into a center row of at least one vertical charge-coupled device in the image sensor comprises:

with a first charge injector, injecting a first charge into a center row of a first vertical charge-coupled device in the image sensor; and with a second charge injector, injecting a second charge into a center row of a second vertical charge-coupled device in the image sensor.

10. The method defined in claim 9 wherein shifting the injected charge to at least one horizontal charge-coupled device comprises:

with the first vertical charge-coupled device, shifting the first charge to the at least one horizontal charge-coupled device; and with the second vertical charge-coupled device, shifting the second charge to the at least one horizontal charge-coupled device.

11. The method defined in claim 10 wherein injecting at least one charge into a center row of at least one vertical charge-coupled device in the image sensor further comprises:

with the first charge injector, injecting a third charge into the center row of the first vertical charge-coupled device in the image sensor; and with the second charge injector, injecting a fourth charge into the center row of the second vertical charge-coupled device in the image sensor.

12. The method defined in claim 11 wherein the at least one horizontal charge-coupled device includes upper and lower horizontal charge-coupled devices, wherein the first and second charges are shifted to the upper horizontal charge-coupled device, and wherein the third and fourth charges are shifted to the lower horizontal charge-coupled device.

13. The method defined in claim 12 wherein shifting the at least one charge to at least one charge switch comprises:

with the upper horizontal charge-coupled device, shifting the first charge to a first charge switch;

with the upper horizontal charge-coupled device, shifting the second charge to a second charge switch;

with the lower horizontal charge-coupled device, shifting the third charge to a third charge switch; and with the lower horizontal charge-coupled device, shifting the fourth charge to a fourth charge switch.

14. The method defined in claim 13 wherein selectively routing the at least one charge to at least one low-gain output when the at least one charge is detected to be above a threshold magnitude and to at least one high-gain output when the at least one charge is detected to be below a threshold magnitude comprises:

with the first charge switch, selectively routing the first charge to a first low-gain output when the first charge is detected to be above a threshold magnitude and to a first high-gain output when the first charge is detected to be below the threshold magnitude;

with the second charge switch, selectively routing the second charge to a second low-gain output when the second charge is detected to be above the threshold magnitude and to a second high-gain output when the second charge is detected to be below the threshold magnitude;

with the third charge switch, selectively routing the third charge to a third low-gain output when the third charge is detected to be above the threshold magnitude and to a third high-gain output when the third charge is detected to be below the threshold magnitude; and with the fourth charge switch, selectively routing the fourth charge to a fourth low-gain output when the fourth charge is detected to be above the threshold magnitude and to a fourth high-gain output when the first charge is detected to be below the threshold magnitude.

15. The method defined in claim 14 wherein adjusting gains of the at least one high-gain output and the at least one low-gain output such that the gains are linearly matched comprises:

adjusting the gains of each of the high-gain outputs and each of the low-gain outputs such that the gain of each high-gain output is respectively linearly matched with the gain of a corresponding one of the low-gain outputs.

16. The method defined in claim 15 further comprising:
with floating gate sense nodes in the upper and lower horizontal charge-coupled devices, detecting magnitudes of the first, second, third, and fourth charges;
calculating the gains of electron multiplying charge-coupled devices at each of the high-gain outputs based on average signal values at each of the high-gain outputs and each of the low-gain outputs;
matching the gains of each of the high-gain outputs by adjusting the gain at each of the high-gain outputs based on measured high-gain output values; and
matching the gains of each of the low-gain outputs by adjusting the gain at each of the low-gain outputs based on measured low-gain output values.

17. The method defined in claim 8 wherein injecting at least one charge into a center row of at least one vertical charge-coupled device in the image sensor comprises:
optically injecting at least one charge into a center row of at least one vertical charge-coupled device in the image sensor.

18. A method for calibrating a gain of a outputs of an image sensor in an imaging system comprising:
with a first charge injector, injecting first test charges into a first vertical charge-coupled device in the image sensor;
with a second charge injector, injecting second test charges into a second vertical charge-coupled device in the image sensor;
with the first vertical charge-coupled device, transferring a first portion of the first test charges to an upper horizontal charge-coupled device and transferring a second portion of the first test charges to a lower horizontal charge-coupled device;
with the second vertical charge-coupled device, transferring a first portion of the second test charges to the upper horizontal charge-coupled device and transferring a second portion of the second test charges to the lower horizontal charge-coupled device;
with the upper horizontal charge-coupled device, transferring the first portion of the first test charges to a first output through a first charge switch;
with the upper horizontal charge-coupled device, transferring the first portion of the second test charges to a second output through second charge switch;
with the lower horizontal charge-coupled device, transferring the second portion of the first test charges to a third output through a third charge switch;
with the lower horizontal charge-coupled device, transferring the second portion of the second test charges to a fourth output through a fourth charge switch; and
calibrating the first, second, third, and fourth outputs to have matching gains based on measured magnitudes of the first and second portions of the first test charges and the first and second portions of the second test charges, wherein the magnitudes are measured at the respective first, second, third and fourth outputs.

19. The method defined in claim 18 wherein calibrating the first, second, third, and fourth outputs is performed continuously while the imaging system is in use and wherein the first test signals and the second test signals are injected into each image frame captured by the image sensor such that the gains of the first, second, third and fourth outputs are continuously stabilized.

* * * * *